United States Patent [19]
Eden

[11] 4,300,064
[45] Nov. 10, 1981

[54] SCHOTTKY DIODE FET LOGIC INTEGRATED CIRCUIT

[75] Inventor: Richard C. Eden, Thousand Oaks, Calif.

[73] Assignee: Rockwell International Corporation, El Segundo, Calif.

[21] Appl. No.: 11,266

[22] Filed: Feb. 12, 1979

[51] Int. Cl.³ ............... H03K 19/094; H03K 19/017; H03K 19/20
[52] U.S. Cl. .................................. 307/446; 307/450; 307/458
[58] Field of Search ............... 307/205, 214, 215, 213, 307/446, 450, 458, 317 A

[56] References Cited

U.S. PATENT DOCUMENTS

| | | | |
|---|---|---|---|
| 3,250,917 | 5/1966 | Hofstein | 307/205 |
| 3,299,291 | 1/1967 | Warner, Jr. et al. | 307/205 X |
| 3,969,632 | 7/1976 | Bobenrieth | 307/205 |
| 4,013,896 | 3/1977 | Picquendar et al. | 307/205 X |
| 4,028,556 | 6/1977 | Cachier et al. | 307/205 |
| 4,038,563 | 7/1977 | Zuleeg et al. | 307/205 |
| 4,160,918 | 7/1979 | Nazarian et al. | 307/215 X |
| 4,177,390 | 12/1979 | Cappon | 307/215 X |

FOREIGN PATENT DOCUMENTS 2230125 12/1974 France ............................. 307/205

OTHER PUBLICATIONS

Electronic Design 5, Mar. 1, 1978, pp. 19: "Schottky-Diode/FET Logic Bring VLST into the Real World".
Van Tuyl et al., IEEE Journ. of Solid-State Circuits; vol. SC-9, No. 5, pp. 269-276; 10/74.
Zuleeg et al., IEEE Trans. on Electron Devices; vol. ED-25, No. 6, pp. 628-639; 6/78.
Washburn, "An Application of Boolean Algebra to the Design of Electronic Switching Circuits", pp. 380-389; 9/53.

Primary Examiner—Larry N. Anagnos
Attorney, Agent, or Firm—H. Fredrick Hamann; Craig O. Malin

[57] ABSTRACT

A logic circuit is provided which uses Schottky barrier switching diodes to perform the "OR" logic function on logic inputs. The outputs from the switching diodes control the gate of a field-effect transistor (FET) which provides logic inversion and gain. The source of the FET is grounded and its drain provides the output of the logic circuit. Bias current for the switching diodes and gate turn-off current for the FET are provided by a pull down, and a pull up is provided to operate the FET. In a second embodiment, two separate groups of switching diodes control separate gates of a dual-gated FET to provide a two-level "OR/NAND" logic circuit. In a third embodiment, the outputs from a pair of two-level logic circuits are joined to provide a three-level "OR/NAND/WIRED-AND" logic circuit.

24 Claims, 11 Drawing Figures

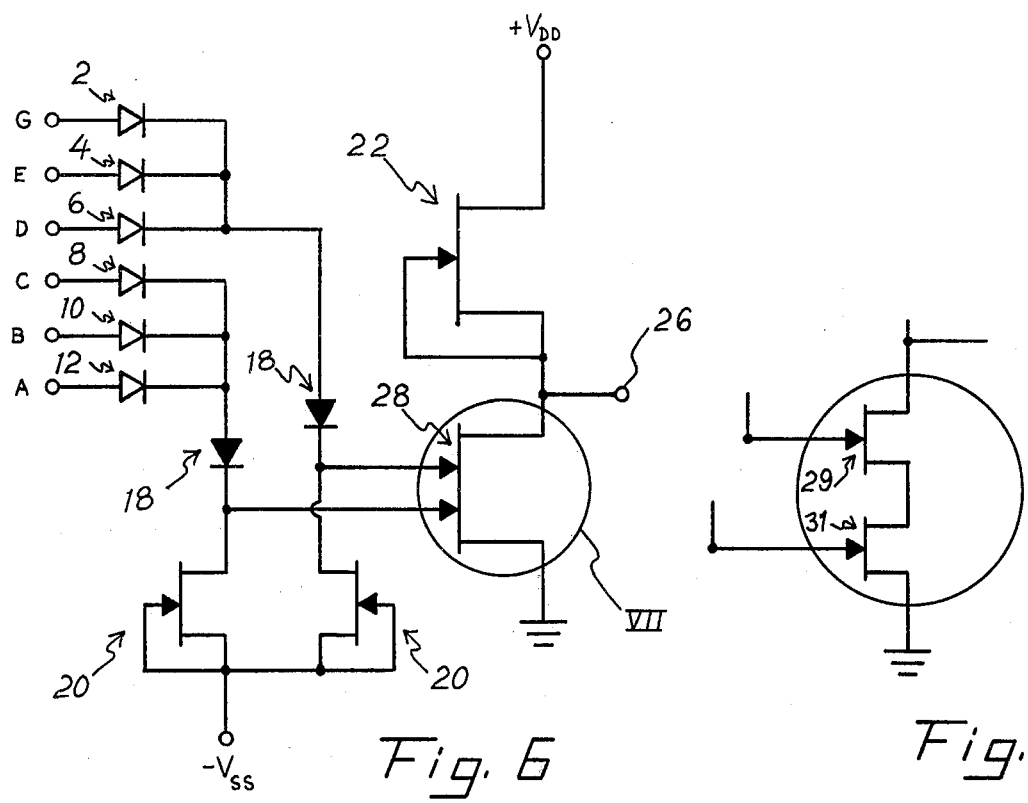
Fig. 6
Fig. 7
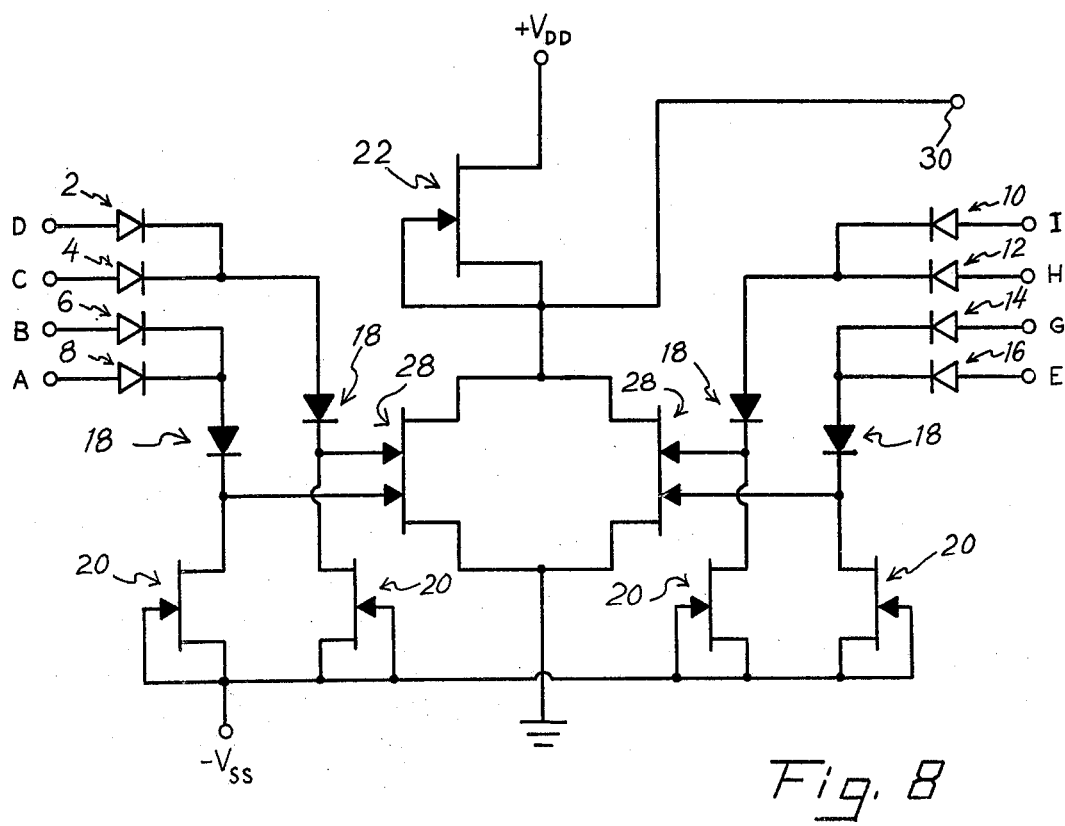
Fig. 8

SCHOTTKY DIODE FET LOGIC INTEGRATED CIRCUIT

STATEMENT OF GOVERNMENT INTEREST

The invention herein described was reduced to practice in the course of or under a contract with the Department of Defense.

BACKGROUND OF THE INVENTION

1. Field of the Invention

This invention relates to the field of solid state electronics and particularly to solid state electronic logic circuits.

2. Description of the Prior Art

Prior art logic integrated circuits in silicon or germanium have utilized p-n diodes as the logic inputs to control the gate of an NPN bi-polar transistor. However, Schottky barrier diodes and field effect transistors (FETs) have not been used to construct such logic integrated circuits in silicon or germanium integrated circuits.

FETs have been used to construct logic integrated circuits in GaAs. In such prior circuits, GaAs FETs (rather than Schottky diodes) are used as the actual nonlinear logic elements. Because FETs are relatively large, these prior art GaAs circuits require considerable chip area. Further, FETs, unlike diodes, are three terminal devices and require additional area for overcrossings. While Schottky barrier diodes have been used in such prior circuits, they have not been used to perform the logic function. Rather, they have been used only for level shifting. Further, the Schottky barrier diodes previously used for level shifting have large areas (about $3\mu \times 20$ to $40\mu$). Consequently, their capacitance is high and they do not provide the high speed and low current operation that is desirable in the actual non-linear logic elements.

SUMMARY OF THE INVENTION

It is an object of the invention to provide an improved logic integrated circuit (IC).

It is an object of the invention to provide a logic IC which is simple and has high density.

It is an object of the invention to provide a logic IC which is low power, has very low dynamic switching energy, and high switching speeds (very low propagation delay).

According to the invention, a logic circuit is provided which uses Schottky barrier switching diodes to perform the "OR" logic function on logic inputs. The outputs from the switching diodes control the gate of a field-effect transistor (FET) which provides logic inversion and gain. The source of the FET is grounded and its drain provides the output of the logic circuit. Bias current for the switching diodes and gate turn-off current for the FET are provided by a pull down, and a pull up is provided to supply the FET drain current and output current. In a second embodiment, two separate groups of switching diodes control separate gates of a dual-gated FET to provide a two-level "OR/NAND" logic circuit. In a third embodiment, the outputs from a pair of two-level logic circuits are joined to provide a three-level "OR/NAND/WIRED-AND" logic circuit.

These and other objects and features of the present invention will be apparent from the following detailed description, taken with reference to the accompanying drawings.

BRIEF DESCRIPTION OF THE DRAWINGS

FIG. 6 is a schematic of an "OR/NAND" two-level logic gate in SDFL;

FIG. 7 is an alternate embodiment of the portion of the circuit shown in circle VII of FIG. 7;

FIG. 8 is a schematic of an "OR/NAND/WIRED-AND" three-level logic gate in SDFL;

DESCRIPTION OF THE PREFERRED EMBODIMENT

Figure 1:
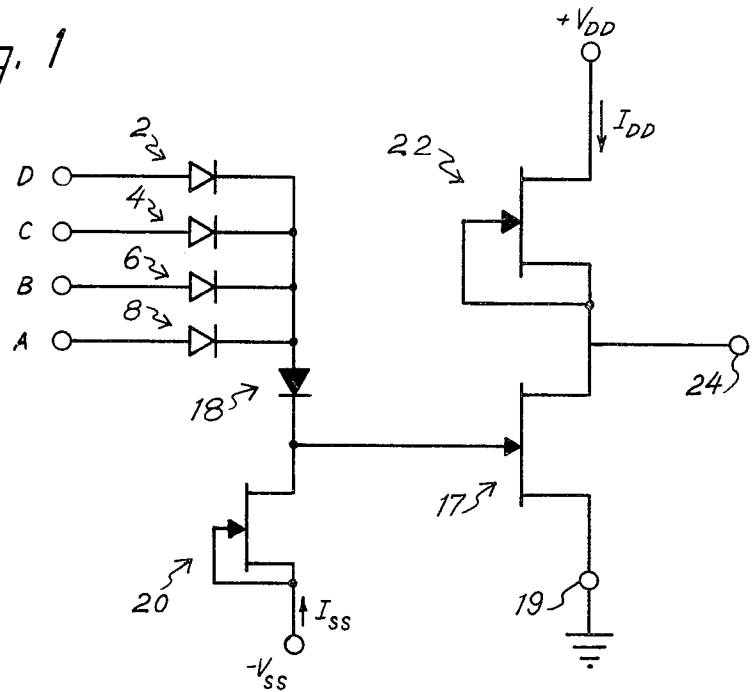
FIG. 1 is a schematic of a "NOR" single level logic gate in Schottky diode FET logic (SDFL)

FIG. 1 shows the circuit diagram for a simple 4-input Schottky diode FET logic "NOR" gate. The circuit may be fabricated in Si, Ge, GaAs, InP, or other Group III-V semiconductor materials. However, for purposes of illustration, a GaAs, monolithic digital IC is described in detail. The circuit configuration is that of current-sourcing diode logic with (assuming positive logic) the four small, high-speed switching diodes 2–8 performing the "OR" logic functions on the four logic inputs A, B, C, and D. Switching diodes 2–8 are high conductance GaAs Schottky barrier diodes which typically are about $1 \mu m \times 2 \mu m$ in area with $C_J \approx 2 \times 10^{-15} F$. In addition to their logic function, these switching diodes 2–8 provide $\sim 0.75$ volt of level shifting between the positive logic levels from previous stages and the negative gate voltages required by the normally-on, depletion mode Schottky gate GaAs Fets 17. For very low pinchoff voltage GaAs Fets ($\sim -0.5$ V), switching diodes 2–8 alone provide adequate level shifting for very low voltage and very low power ICs. By adding one or more level shift diodes 18 in series, GaAs FETs 17 with slightly higher pinchoffs ($\sim -1.25$ V) may be used with higher supply voltages and logic swings. The data presented here is for gates with this shift diode.

A pull down current sink (PD) 20 is provided to bias diodes 2–8 and to furnish gate turn-off current for GaAs FET 17. As shown in FIG. 1, PD 20 is a shorted gate ($V_{gs}=0$) metal Schottky gate FET (MESFET) although other current sources such as a resistor could be used. The drain of PD MESFET 20 is connected in parallel to the level shifted output of diodes 2–8 and to the gate of GaAs FET 17. Its source is connected to a negative voltage supply ($-V_{ss}$) which is typically $-1.5$ V.

The depletion mode GaAs FET 17 (which preferably is a GaAs metal Schottky gate FET [MESFET]) is operated with a depletion mode load pull up current source (PU) 22 which, like PD 20 is a shorted gate MESFET 22 or functionally equivalent current source structure such as a resistor. As shown in FIG. 1, the source of PU MESFET 22 is connected to the drain of GaAs FET 17, and its drain is connected to a positive voltage supply ($+V_{DD}$) which is typically $+2.5$ V.

The source of FET 17 is connected to ground 19. As used in this invention, "ground" is defined as a fixed reference potential to which the logic voltage levels are referred; i.e. a "low" is a voltage near this "ground" reference level. Of course, all the voltage levels could be shifted by fixed amounts and the circuit would work equally well, but then the source voltage of FET 17 might be at a different reference of "ground" potential.

MESFET 17 provides logic inversion and gain for the circuit, and its drain is the output 24 of the logic circuit. Such output is a "not or" (NOR) output which, for inputs A, B, C, and D, is expressed as $F=\overline{A+B+C+D}$. In the preferred embodiment shown in FIG. 1, GaAs FET 17 is a depletion mode GaAs metal Schottky gate FET (MESFET). However, other types of FETs such as metal oxide semiconductor FETs (MOSFETs), metal insulator semiconductor FETs (MISFET), and other mode FETs such as enhancement mode FETs or enhancement-depletion mode FETs can be utilized by modification of the circuit within the skill of the artisan.

PD MESFET 20 is kept small (typically $\leq 20\%$ of the width of MESFET 17), because in this current-sourcing logic the DC fanout is limited to the current ratio between PU AND PD (typically 3 or 4). Typical width ratios between these devices (assuming equal gate lengths) is of the order of 1.0:0.8:0.2 for MESFET 17, PU MESFET 22, and PD MESFET 20, respectively. For example, if these three MESFETs all have a $1\mu$ long gate and MESFET 17 has a $10\mu$ gate width, then the PU MESFET gate would be about $8\mu$ wide and the PD MESFET gate would be about $2\mu$ wide. For reasonably small fanout loadings (e.g., F.O.=3 for the exemplary circuit), the output 24 is taken directly from the drain of MESFET 17 as shown in FIG. 1. For larger fanout drive capabilities, the driving gate can be scaled up, or its output can be buffered with a source-follower or similar buffer stage.

Figure 3:
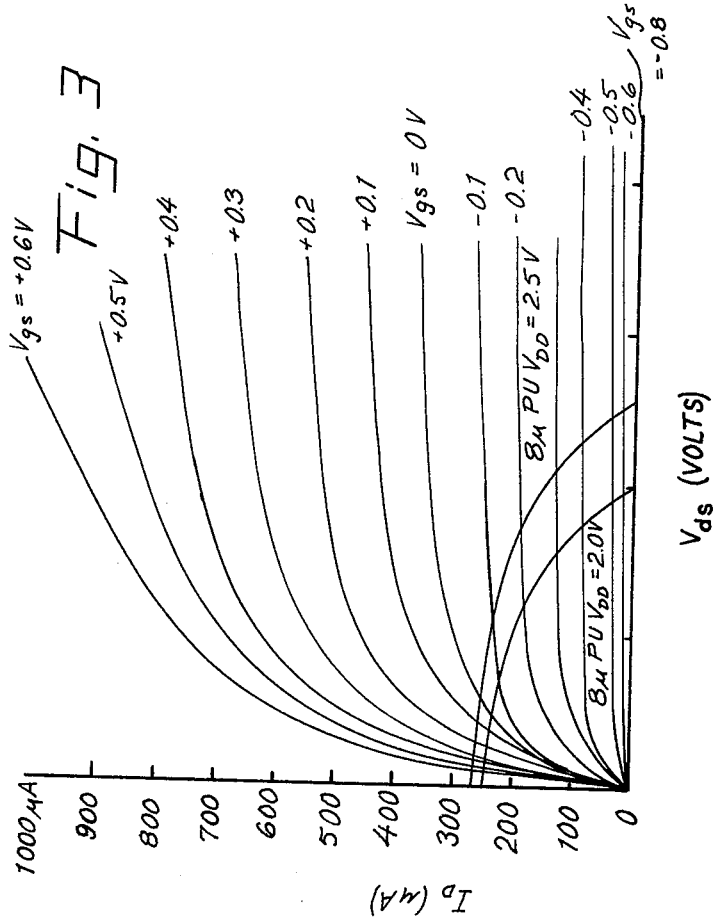
FIG. 3 is a set of characteristic curves of drain current versus drain-source voltage for various gate voltages for the depletion mode GaAs MESFET of FIG. 2.
Figure 2:
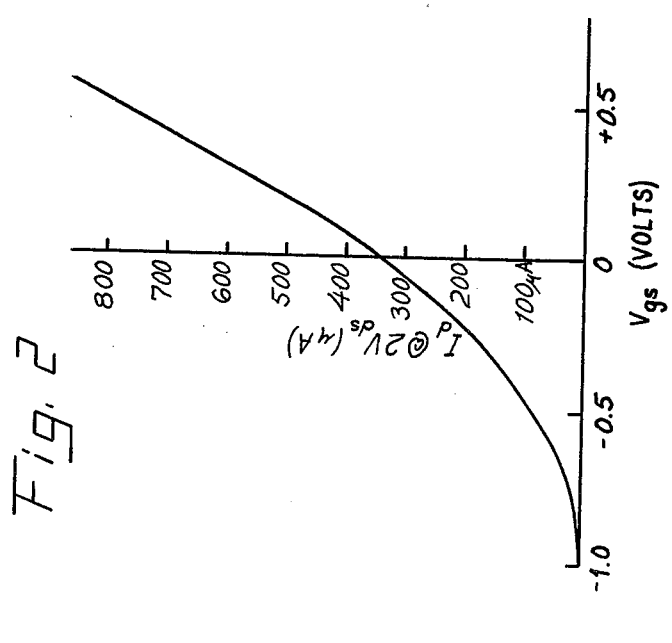
FIG. 2 is a saturated drain current versus gate voltage characteristic curve of a depletion mode, GaAs metal Schottky FET (MESFET) used in evaluating the circuit of FIG. 1.

FIGS. 2-5 show a graphical analysis of the input-output transfer characteristics calculated for the SDFL NOR logic gate shown in FIG. 1 and having MESFETs 17, 20, 22 with the gate dimensions described above. It is assumed that there is a 0.7 volt forward voltage drop each across switching diodes 2-8 and across level shift diode 18 at a 60 $\mu$A pull down bias current ($I_{ss}$). The voltage-current characteristics of the depletion mode, GaAs MESFET 17 used in the exemplary circuits are shown in FIGS. 2 and 3.

Figure 5:
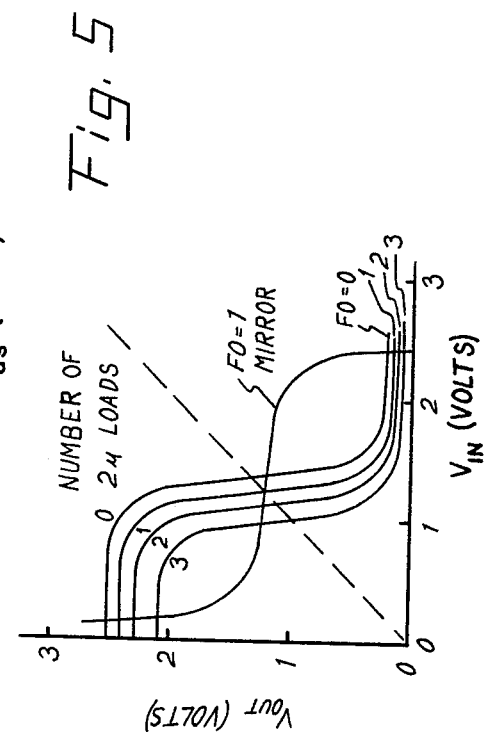
FIG. 5 is the same as FIG. 4 except for the circuit when $V_{DD}=2.5$ V.
Figure 4:
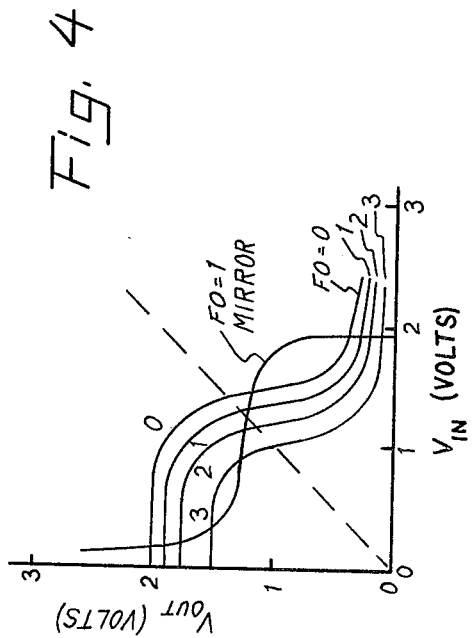
FIG. 4 is a calculated curve showing the transfer characteristics from a gate input to the output for the circuit of FIGS. 1–3 when $V_{DD}=2.0$ V for various gate loadings.

FIG. 4 shows the calculated static transfer characteristics from a gate input (with other inputs grounded) to the output for $V_{DD}=2.0$ V and for various numbers of 60 $\mu$A load currents (FO=0 to 3) representing pull down loadings on the gate. FIG. 5 is for the same conditions except that $V_{DD}=2.5$ V. As can be seen, calculated noise margins are excellent, except for the most severely loaded case (comparing FO=3 to FO=0 at $V_{DD}=2$ V).

FIG. 6 is a circuit diagram of a second embodiment of the invention which provides an "or not and" (OR/NAND) two-level logic gate with an output 26 expressed as $F=\overline{(A+B+C)\cdot(D+E+G)}$ for positive logic inputs A-G. The same reference numbers are used in FIGS. 1 and 6 to described similar elements, and it can be readily seen that the two-level logic of FIG. 6 comprises two one-level logic circuits of FIG. 1 except that the outputs of the diodes control separate gates of a single, dual-gate FET 28.

As shown in FIG. 6, high-speed switching diode clusters 2, 4, 6, and 8, 10, 12 perform the logical "OR" function on clustered inputs A, B, C, and D, E, G. The dual-gate FET 28 (or its equivalent embodiment, two single-gate FETs 29, 31 in series, as shown in FIG. 7) perform the logical "NAND" function. Any number of diode inputs may be used in the "OR" function, while the number of series FETs usable for "NAND" functions is limited by the "ON" resistance or saturated voltage drop of the multi-gate FET or series of FETs used for inversion and gain.

FIG. 8 shows a three-level SDFL gate performing the "OR/NAND/WIRE-AND" function as obtained by wiring two or more of the "OR/NAND" gates of FIG. 6 with a common drain pull up to obtain a "WIRED-AND" function which is expressed at output 30 as $F=\overline{[(A+B)\cdot(C+D)]}+\overline{[(E+G)\cdot(H+I)]}$ for inputs A-I. Any combination of "NOR" (FIG. 1) or "OR/NAND" (FIG. 6) can be "WIRED-AND" connected for three-level gates of the type in FIG. 7, depending on the logic function desired.

Figure 9:
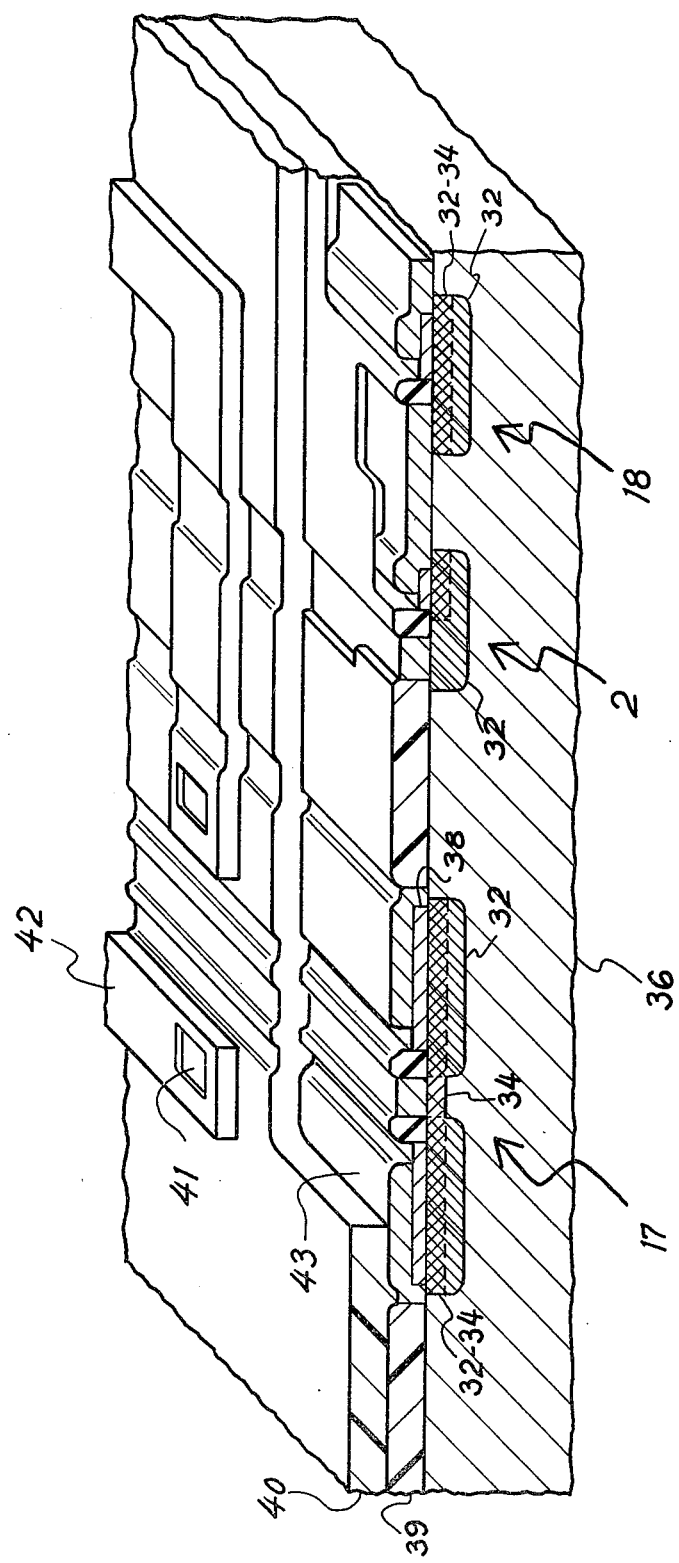
FIG. 9 is a perspective view of portion of a GaAs integrated circuit using SDFL.

FIG. 9 is a cutaway, perspective view of a GaAs IC utilizing the SDFL of the invention. The high speed Schottky barrier switching diodes 2-16 require a much lower sheet resistance n-layer 32 than is required for the GaAs FET 17 active layers 34. These requirements are met with a planar, multiple localized ion-implantation process. Two different implants 32, 34 into the semi-insulating GaAs substrate 36 are used; one 34 optimized for the GaAs FET 17 active regions and the other 32 for the Schottky switching diodes 2-16, with both implants 32, 34 used for maximum doping, such as for ohmic contacts 38 or shift diode 18. In this embodiment, the unimplanted semi-insulating substrate material provides the electrical isolation between circuit elements. The planar fabrication method could equally well be used on high resistivity buffer layers on the GaAs substrate. It should also be possible to fabricate such SDFL circuits using fabrication procedures other than this planar, localized implantation process. Also shown in FIG. 9 are substrate insulator 39, second level insulator 40, and first (Schottky) level and second level interconnects 41, 42, 43.

Figure 10:
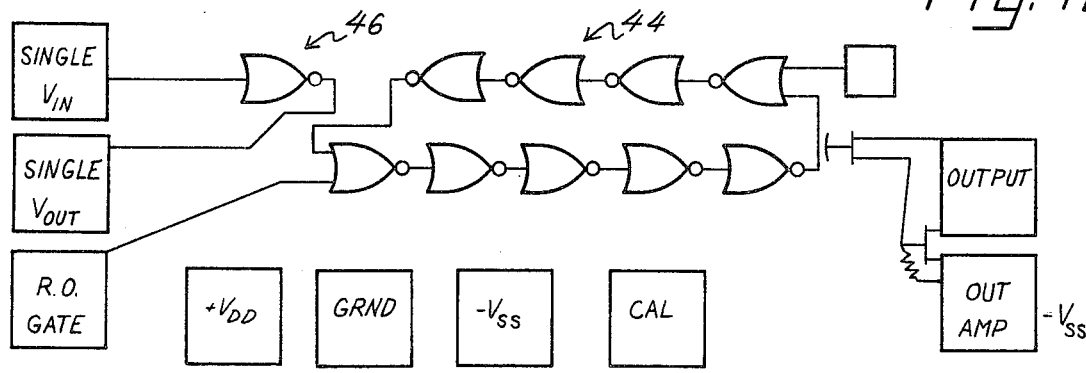
FIG. 10 is a schematic of a nine-stage ring oscillator of SDFL "NOR" gates used to evaluate the performance of the logic circuit.

A nine-stage ring oscillator 44 was fabricated to evaluate the performance of simple SDFL NOR gates of the type shown in FIG. 1. FIG. 10 shows the logic diagram and chip layout for this test oscillator 44. In the SDFL NOR gates used in this circuit, the switching FET 17 is nominally $10\mu$ wide with a $1\mu$ gate length, while PU FET 22 is $7\mu$ wide and PD FET 20 is $2\mu$ wide. The switching diodes 2-8 are nominally $1\mu \times 2\mu$, while level shifting diode 18 is about $3\mu$ square.

These ring oscillators were operated both CW (with the extra R.O. gate input open as grounded, or gated by applying a square wave or pulse gating waveform [swinging from $+0.5$ V to $+1.5$ V]) to the R.O. gate pad of oscillator 44 in FIG. 10. The oscillation frequency for this N=9 stage ring oscillator under either gated or CW operating conditions was $f_o=393.74$ MHz or $\tau_D=1/(2Nf_o)=141$ ps with a $P_D 335$ μW/gate power dissipation, for a dynamic switching energy of only $P_D\tau_D=47.3$ fJ. An extra single gate "NOR" circuit 46 was provided on the chip shown in FIG. 10 to determine its low frequency transfer characteristics ($V_{out}$ vs $V_{in}$ such as shown in FIGS. 4 and 5). Under these same bias conditions the average power dissipation of this single gate circuit is 450 μW/gate, the input threshold is about 1.1 V, and the output swing without load is from ~300 mV to $+V_{DD}$ (ac gain $\propto V_{DD}$). Propagation delays as low as $\tau_D=95$ ps were measured on these 10μ nominal FET width SDFL NOR gates. Measurements were also made on similar 7-stage ring oscillators of larger, 20μ, SDFL NOR gates which gave propagation delays as low as $\tau_D=75$ ps (~100 ps typical), with speed power products in the $P_D\tau_D=200$ to 250 fJ range (0.2 to 0.25 pJ). Smaller 5 μm FET width SDFL NOR gate 9-stage ring oscillators were also measured, achieving dynamic switching energies as low as $P_D\tau_d=27$ fJ at $\tau_d=156$ pS propagation delays in very low power ($P_D=170$ μW) single-diode (shift diode 18 omitted) versions.

Figure 11:
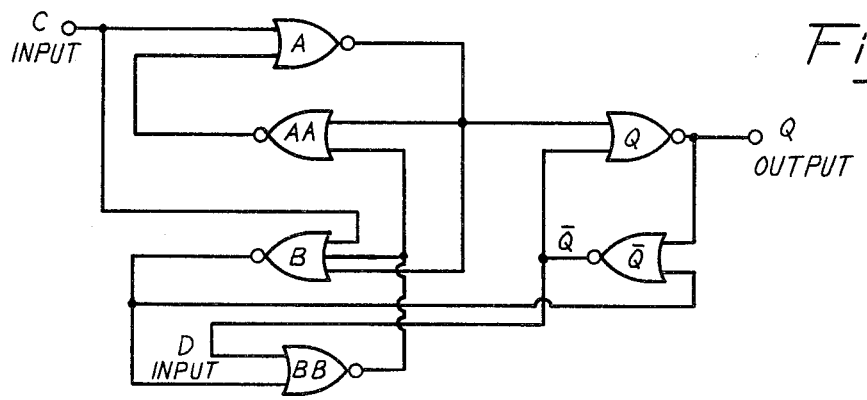
FIG. 11 is a schematic of a "NOR"-implemented type D flip flop.

In addition to these ring oscillators, more complex logic circuits have been fabricated and successfully tested using GaAs SDFL. For example, a type D flip flop using the circuit diagram of FIG. 11 was successfully demonstrated. In this circuit, 6 SDFL NOR gates comprise the basic D flip flop. In the implementation shown, the $\overline{Q}$ output of the D flip flop is connected back to the D input so that the Q output of the flip flop changes state each time the clock input makes a logic "high to logic low" transition. Hence, in this "T-connected" mode, the D flip flop functions as a binary frequency divider, producing a Q output at half of the clock input frequency. This circuit was fabricated with 10 μm and 15 μm nominal FET width SDFL NOR gates of the type shown in FIG. 1 with no buffers on the gate outputs, using the planar GaAs IC fabrication procedure shown in FIG. 9. This GaAs IC gave proper divide by two operation with clock input frequencies as high as 1.87 GHz, corresponding to propagation delays in the SDFL NOR gates of about $\tau_d=110$ pS at $P_D\tau_d$ products of 280 fJ. This successfully demonstrates the applicability of unbuffered SDFL gates in complex sequential logic circuits with gate fanout loadings up to three.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A Schottky diode, field effect transistor logic integrated circuit comprising:
   a semiconductor;
   at least two Schottky barrier switching diodes on said semiconductor, the cathodes of said diodes being connected to a common conductor, and the anodes of said diodes providing separate logic inputs for the integrated circuit;
   a field-effect transistor (FET) on said semiconductor having a grounded source, a drain which provides a logic output for the integrated circuit, and a gate connected to said common conductor;
   a bias current means on said semiconductor connected to said common conductor to provide bias current for said diodes, and gate activation current for said FET; and
   a drain current means on said semiconductor connected to the drain of said FET.

2. The integrated circuit as claimed in claim 1, wherein said bias current means comprises a shorted-gate, metal-semiconductor FET (MESFET), said shorted-gate MESFET having its source connected to a voltage supply and its drain connected to said common conductor.

3. The logic circuit as claimed in claim 1, wherein said drain current means comprises a shorted-gate metal-semiconductor FET (MESFET) having its source connected to said drain of said FET and its drain connected to a voltage supply.

4. The integrated circuit as claimed in claim 1, wherein said FET comprises a metal-semiconductor FET (MESFET).

5. The integrated circuit as claimed in claim 1, wherein said FET comprises a metal oxide semiconductor FET (MOSFET).

6. The integrated circuit as claimed in claim 1, wherein said FET comprises a metal-insulator semiconductor FET (MISFET).

7. The integrated circuit as claimed in claim 1, wherein said FET comprises a depletion mode FET.

8. The logic circuit as claimed in claim 1, wherein said FET comprises a depletion-enhancement mode FET.

9. The logic circuit as claimed in claim 1, wherein said FET comprises an enhancement mode FET.

10. The integrated circuit as claimed in claim 1, wherein said semiconductor comprises gallium arsenide (GaAs).

11. The integrated circuit as claimed in claim 1, wherein said semiconductor comprises silicon (Si).

12. The integrated circuit as claimed in claim 1, wherein said semiconductor comprises germanium (Ge).

13. The integrated circuit as claimed in claim 1, wherein said semiconductor comprises InP.

14. The integrated circuit as claimed in claim 1, including a Schottky-barrier voltage shift diode on said semiconductor, and wherein said common conductor comprises a first conductor and a second conductor, said switching diode cathodes being connected to said first conductor and said gate of said FET and said bias current means being connected to said second conductor, and wherein said voltage shift diode is connected in series between said first and second conductors with its polarity in the same direction as the polarity of said switching diodes.

15. The integrated circuit as claimed in claim 14, including at least a second Schottky-barrier voltage shift diode in series with said first mentioned Schottky-barrier voltage shift diode.

16. A Schottky diode field effect transistor logic integrated circuit comprising:
   a semi-insulating gallium arsenide (GaAs) substrate;
   at least two Schottky barrier switching diodes on said substrate, the cathodes of said diodes being connected to a common conductor and the anodes of said diodes providing separate logic inputs for the integrated circiut;
   a depletion-mode, metal semiconductor field-effect transistor (MESFET) on said substrate, said MESFET having a grounded source, a drain which provides a logic output for the integrated circuit, and a gate connected to said common conductor;
a pull down current sink on said substrate connected to said common conductor to provide bias current for said diodes and gate turn off current for said MESFET; and
a pull up current source on said semiconductor connected to the drain of said MESFET.

17. The integrated circuit as claimed in claim 16, including a Schottky-barrier voltage shift diode, and wherein said common conductor comprises a first conductor and a second conductor, said switching diode outputs being connected to said first conductor and said gate of said MESFET and said pull-down current sink being connected to said second conductor, and wherein said voltage shift diode is connected in series between said first and second conductor with its polarity in the same direction as the polarity of said switching diode.

18. The integrated circuit as claimed in claim 17, including at least a second Schottky-barrier voltage shift diode in series with said first mentioned Schottky-barrier voltage shift diode.

19. A Schottky diode, field effect transistor, two-level logic integrated circuit comprising:
a semiconductor;
a dual-gate field effect transistor (FET) on said semiconductor having a grounded source, a drain which provides a logic output for the integrated circuit, and a first and a second gate;
a first conductor on said semiconductor connected to said first gate;
a second conductor on said semiconductor connected to said second gate;
a first plurality of Schottky barrier switching diodes on said semiconductor, the cathodes of said diodes being connected to said first conductor;
a second plurality of Schottky barrier switching diodes on said semiconductor, the cathodes of said diodes being connected to said second conductor;
a bias current means on said semiconductor connected to said first and to said second conductors to provide bias current for said diodes and gate activation current for said FET; and
a drain current means on said semiconductor connected to the drain of said dual-gate FET.

20. The two-level logic integrated circuit as claimed in claim 19, wherein said bias current means comprises first and second metal-semiconductor FETs (MESFETs) with their gates shorted and with their sources connected to a voltage supply, the drain of said first MESFET being connected to said first conductor and the drain of said second MESFET being connected to said second conductor.

21. The two-level logic circuit as claimed in claim 19, wherein said drain current means comprises a shorted-gate metal-semiconductor (FET) (MESFET) having its source connected to said drain of said FET and its drain connected to a voltage supply.

22. A Schottky diode, field effect transistor, two-level logic integrated circuit comprising:
a semiconductor;
a first field-effect transistor (FET) on said semiconductor having a source, a gate, and a drain which provides a logic output for the integrated circuit;
a second field-effect transistor (FET) on said semiconductor having a grounded source, a gate, and a drain connected to said source of said first FET;
a first conductor on said semiconductor connected to said gate of said first FET;
a second conductor on said semiconductor connected to said gate of said second FET;
a first plurality of Schottky barrier switching diodes on said semiconductor, the cathodes of said diodes being connected to said first conductor;
a second plurality of Schottky barrier switching diodes on said semiconductor, the cathodes of said diodes being connected to said second conductor;
a bias current means on said semiconductor connected to said first and to said second conductors to provide bias current for said diodes and gate activation current for said first and second FETs; and
a drain current means on said semiconductor connected to the drain of said first FET.

23. A Schottky diode, field effect transistor, two-level logic integrated circuit comprising:
a semi-insulating gallium arsenide (GaAs) substrate;
a dual gate depletion-mode, metal semiconductor field-effect transistor (MESFET) on said substrate having a grounded source, a drain which provides a logic output for the integrated circuit, and a first and a second gate;
a first conductor on said substrate connected to said first gate;
a second conductor on said substrate connected to said second gate;
a first Schottky barrier voltage shift diode on said substrate having its cathode connected to said first conductor;
a second Schottky barrier voltage shift diode on said substrate having its cathode connected to said second conductor;
a first plurality of Schottky barrier switching diodes on said substrate, the cathodes of said switching diodes being connected to the anode of said first shift diode and the anodes of said switching diodes providing separate logic inputs for the integrated circuit;
a second plurality of Schottky barrier switching diodes on said substrate, the cathodes of said switching diodes being connected to the anode of said second shift diode and the anodes of said switching diodes providing separate logic inputs for the integrated circuit;
first and second metal-semiconductor FETs (MESFETs) on said substrate with their gates shorted and with their sources connected to a voltage supply, the drain of said first MESFET being connected to said first conductor and the drain of said second MESFET being connected to said second conductor, whereby a bias current is provided for said first and second plurality of switching diodes and a turn-off current is provided for said dual-gate FET; and
a third shorted gate metal-semiconductor FET on said substrate having its source connected to said drain of said dual-gated FET and its drain connected to a voltage supply, whereby a pull up current source is provided said dual-gated FET.

24. A Schottky diode, field effect transistor, three-level logic integrated circuit comprising:
a pair of two-level logic integrated circuits having their logic outputs joined to form a common logic output for said three-level logic integrated circuit, each of said pair comprising:
a semiconductor;

a dual-gate field-effect transistor (FET) on said semiconductor having a grounded source, a drain which provides a logic output for the integrated circuit, and a first and a second gate;

a first conductor on said semiconductor connected to said first gate;

a second conductor on said semiconductor connected to said second gate;

a first plurality of Schottky barrier switching diodes on said semiconductor, the cathodes of said diodes being connected to said first conductor;

a second plurality of Schottky barrier switching diodes on said semiconductor, the cathodes of said diodes being connected to said second conductor;

a bias current means on said semiconductor connected to said first and to said second conductors to provide bias current for said diodes and gate activation current for said FET; and a drain current means on said semiconductor connected to the drain of said dual-gate FET.

* * * * *